United States Patent [19]

Sato

[11] 3,960,560

[45] June 1, 1976

[54] METHOD FOR PRODUCING A PHOTOMASK

[75] Inventor: Masamichi Sato, Asaka, Japan

[73] Assignee: Fuji Photo Film Co., Ltd., Minami-ashigara, Japan

[22] Filed: Oct. 9, 1974

[21] Appl. No.: 513,434

[30] Foreign Application Priority Data

Oct. 9, 1973     Japan.............................. 48-113631

[52] U.S. Cl..................................... 96/36; 96/36.2;
96/38.3; 156/13; 156/15; 252/79.2; 252/79.3;
252/79.5; 355/125; 355/133

[51] Int. Cl.² .................... G03C 5/00; C09K 13/08;
G03B 27/00; G03C 11/00

[58] Field of Search............ 96/38.3, 36.2, 36, 60 R;
156/13, 15; 355/125, 132, 133; 292/79.2,
79.3, 79.5

[56] References Cited

UNITED STATES PATENTS

| 3,561,963 | 2/1971 | Kiba............................ 96/38.3 UX |
| 3,567,446 | 3/1971 | Gleadle................................ 96/36 |
| 3,567,447 | 3/1971 | Chand................................. 96/36 |
| 3,669,665 | 6/1972 | Faigenbaum et al. ........... 96/36.2 X |
| 3,674,492 | 7/1972 | Goldrick et al.................. 96/38.3 X |
| 3,744,904 | 7/1973 | Loprest et a................... 96/38.3 UX |
| 3,765,901 | 10/1973 | Schellekens et al. ............ 96/36.2 X |

*Primary Examiner*—William A. Powell
*Assistant Examiner*—Thomas Boken
*Attorney, Agent, or Firm*—Sughrue, Rothwell, Mion, Zinn & Macpeak

[57] ABSTRACT

A method for producing a photomask, by exposing and development-processing a photographic material including a transparent support having thereon a masking layer and a silver halide emulsion layer to thereby form a silver image, etch-bleaching the silver halide emulsion layer to thereby remove the silver image areas, baking the remaining non-silver image areas to thereby decompose the binder contained therein, subjecting the coated support to etching to thereby remove the masking layer located at the areas corresponding to the silver image, and removing the decomposed binder to thereby uncover the masking layer at the areas corresponding to the non-silver image areas.

15 Claims, 6 Drawing Figures

METHOD FOR PRODUCING A PHOTOMASK

BACKGROUND OF THE INVENTION

1. Field of the Invention

The present invention relates to a method for producing a photomask and, more particularly, it relates to a method for producing a photomask with ease using a silver halide photographic material.

2. Description of the Prior Art

It is known in the field of printed circuit fabrication or microelectronic fabrication to use a photomask in forming images utilizing a photoresist method. Heretofore, photomasks have often utilized silver images or chromium images. Silver images are obtained by imagewise exposing a photographic light-sensitive material (emulsion mask) provided on a glass plate, followed by ordinary photographic processings (e.g., development and fixing). On the other hand, chromium images are formed by providing a vacuum-deposited chromium layer on a glass support and etching the chromium layer using a photo etching method. That is, a photo resist is coated on the chromium layer and, after exposure through a photo mask superposed thereon (contact method) or after projecting a photo mask on the photoresist (projection method), the photoresist is development-processed to form a resist image, followed by etching the chromium layer.

Since an emulsion mask has high sensitivity, it is suitable for preparing a photo mask. However, the resolving power of a photo mask obtained is inferior to that of a chromium mask using the projection method due to scattering of light by silver grains, the high thickness of the silver halide emulsion layer and silver particles after development. A photo mask utilizing silver images is inferior in resolving power for the following additional reasons. That is, since the developed emulsion thickness is larger at silver image areas than at non-image areas, gaps or spaces are formed at the contact surfaces upon intimately contacting the photo mask with the photoresist layer in order to form a resist image, thus markedly reducing the resolving power. In addition, the photo mask formed by the silver image has such a small mechanical strength that it is easily damaged. Also, since the silver image does not transmit visible light, positioning of the mask is difficult.

On the other hand, a chromium mask using a contact method is inferior to a photo mask obtained from a silver image in resolving power, since the former is reduced in resolving power upon exposing a photoresist layer and upon etching the vacuum-deposited chromium layer. Also, with a chromium mask using a projection method, the photoresist layer has such a low sensitivity that exposure requires too much time, and thus is not industrially practical.

SUMMARY OF THE INVENTION

It is, therefore, an object of the present invention to provide a method for producing a photomask having high sensitivity, high resolving power and excellent durability.

Another object of the present invention is to provide a method for producing a photomask without using a photoresist process.

The above-described objects of the present invention can be attained by exposing and development-processing a photographic material comprising a transparent support having thereon a masking layer and a silver halide emulsion layer to thereby form a silver image, etch-bleaching the silver halide emulsion layer to thereby remove the silver image areas, baking the non-silver image areas remaining to thereby decompose the binder contained therein, subjecting the support to etching to thereby remove the masking layer located at the areas corresponding to the silver image, and removing the decomposed binder to thereby uncover the masking layer at the areas corresponding to the non-silver image areas.

DETAILED DESCRIPTION OF THE INVENTION

Figure 1:
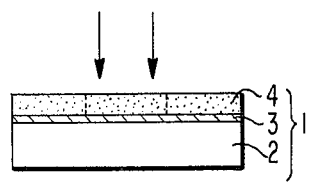
FIGS. 1 through 6 are the illustrations showing one embodiment of the method of the present invention. In each figure, numeral 1 designates a photographic light-sensitive material, 2 a transparent support, 3 a masking layer, 3a a masking layer corresponding to the silver image areas, 3b a masking layer corresponding to the non-silver image areas, 4a silver image areas, 4b a binder layer (non-image areas), and 5 a photomask.

The photographic material used in the present invention fundamentally comprises a transparent support having thereon a masking layer and a silver halide emulsion layer.

That is, the photographic material of this invention is different from ordinary silver halide photographic materials in that it possesses a masking layer. It should be noted that such masking layer will perform an extremely important function when combined with the procedures of etch-bleaching and baking to be described hereinafter.

Suitable transparent supports include a glass plate, quartz, sapphire, plastic films (e.g., a cellulose acetate film, a cellulose nitrate film, a polyethylene terephthalate film, a polystyrene film, etc.), and the like.

The support must be transparent since it is a necessary condition for mask-positioning as is well known in the ordinary photomask art. However, the transparent support is not particularly limited in the present invention with respect to its other characteristics.

The masking layer is provided by depositing a masking material on a transparent support using vacuum deposition, sputtering, ion plating, chemical plating or the like. Suitable masking materials are metal oxides such as silicon dioxide, chromic oxide, ferric oxide, magnetic iron oxide, (iron(II)-iron(III) oxide), cuprous oxide, cupric oxide, nickel oxide, cobalt oxide, germanium oxide, cadmium oxide, titanium oxide, or tantalum oxide, etc., metals such as chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, nickel-chromium alloy, etc., semi-metals such as silicon, germanium, etc., chalcogen glasses such as As-S-Ge, As-Se-Ge-, Ge-S, etc., and the like. The masking material provides a masking effect in particular with respect to light, and is preferably selected from those materials which transmit visible light of a wavelength not less than 450 nanometers (nm) and absorb ultraviolet light having a wavelength shorter than 450 nm.

The thickness of the masking layer cannot definitely be specified since it varies depending upon the end-use thereof. However, in general, a range of from about 0.01 μ to 10 μ, preferably 0.07 μ to 1.5 μ, is employed. If the layer is too thin, absorption of ultraviolet light is too small, while, if the layer is too thick, etching becomes difficult, causing the problem of side-etching. Since a metal or a metal oxide possesses a much greater mechanical strength as compared with a photographic emulsion layer or the like, a metal or a metal oxide renders the photomask scratch resistant.

The silver halide emulsion layer is coated directly on the masking layer or on one or more subbing layers on the masking layer. The subbing layer which can be used in the present invention is a layer which intimately adheres to both the masking layer and the silver halide emulsion layer. Where the masking layer is extremely different in property from the silver halide emulsion layer, two or more subbing layers can be employed. More specifically, those subbing layers described in Japanese Patent Publication Nos. 5509/64, 2597/69, 11616/71, U.S. Patent 3,492,122, West German Patent OLS No. 2,001,727, etc., are suitable. Also, a subbing layer formed by providing a thin polyvinyl acetate layer (for example, a thickness of about 0.1 to 0.3 μ) and bringing the surface into contact with an alkaline aqueous solution such as an aqueous solution of sodium hydroxide for saponification can be used. A suitable thickness for the subbing layer can range from about 0.1 to 0.5 μ.

The silver halide emuslion coated on the masking layer or on a subbing layer(s) on the masking layer can be obtained by dispersing silver halide in an water-soluble binder. Illustrative silver halides are silver chloride, silver bromide, silver iodide, silver chlorobromide, silver bromoiodide, silver chlorobromoiodide, etc. A most typical silver halide emulsion is an emulsion which contains about 90 mol% or more silver bromode (preferably containing not more than about 5 mol% silver iodide) and contains silver halide of a mean grain size of not more than about 0.1 μ(a so-called Lippmann emulsion), and in which the weight ratio of the silver halide to the water-soluble binder is about 1:4 to about 6:1. Another example of a silver halide emulsion is an emulsion which contains about 50 mol% or more (preferably 70 mol% or more) silver chloride and contains silver halide of a mean grain size of not more than about 1.0 μ.

On the other hand, typical water-soluble binders are, e.g., gelatin, colloidal albumin, casein, cellulose derivatives (e.g., carboxymethyl cellulose, hydroxyethyl cellulose, etc.), saccharide derivatives (e.g., agar-agar, sodium, alginate, starch derivatives, etc.), synthetic hydrophilic colloids (e.g., polyvinyl alcohol, poly-N-vinyl pyrrolidone, polyacrylic acid copolymers, polyacrylamide, a derivative thereof, etc.). If desired, a compatible mixture of two or more of these binders can be used. Of these, the most preferred binder is gelatin. Gelatin can be replaced, partly or completely, by a synthetic high molecular weight substance, by a so-called gelatin derivative (prepared by reacting gelatin with a compound containing a group capable of reacting with the functional groups contained in the gelatin molecule (i.e., amino groups, imino groups, hydroxy groups or carboxy groups)), or by a graft polymer prepared by grafting a molecular chain of another high molecular weight substance to the gelatin molecule. Illustrative compounds for preparing gelatin derivatives are, e.g., isocyanates, acid chlorides and acid anhydrides as described in U.S. Pat. No. 2,614,928, acid anhydrides as described in U.S. Pat. No. 3,118,766, bromoacetic acid as described in Japanese Patent Publication No. 5514/64, phenyl glycidyl ethers as described in Japanese Pat. Publication No. 21845/67, vinyl sulfone compounds as described in U.S. Pat. No. 3,132,945, N-allylvinylsulfonamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Pat. No. Publication No. 26845/67, acid esters as described in U.S. Pat. No. 2,763,639, alkanesultones as described in British Pat. No. 1,033,189, and the like. High polymer chains to be grafted to the gelatin are described in U.S. Pat. Nos. 2,763,625; 2,831,767; 2,956,884; *Polymer Letters*, 5, 595 (1967), Phot. Sci. Eng., 9, 148 (1965), *J. Polymer Sci. A-*1 9, 3199 (1971), and the like. Homopolymers or copolymers of those compounds which are generally called vinyl monomers, such as acrylic acid, methacrylic acid, the ester, amide, and nitrile derivatives thereof, styrene, etc., can be widely used. However, hydrophilic vinyl polymers having some compatibility with gelatin, such as the homopolymers or copolymers of acrylic acid, acrylamide, methacrylamide, hydroxyalkyl acrylate, hydroxyalkyl methacrylate, etc., are particularly preferred.

These emulsions can be advantageously optically sensityzed with known optical sensitizers such as the cyanine dyes and merocyanine dyes as described in U.S. Pat. Nos. 1,346,301; 1,846,302; 1,942,854; 1,990,507; 2,493,747; 2,739,964; 2,493,748; 2,503,776; 2,519,001; 2,666,761; 2,734,900; 2,739,149; and British Pat. No. 450,958.

Suitable exposures for the silver halide emulsion can be to electromagnetic radiation, to which the silver havlide emulsion is sensitive, e.g., visible, ultraviolet, electron beam, X-ray, etc. With the optically sensitized photographic light-sensitive materials, it is convenient to select light mainly of a wavelength corresponding to the optically sensitized region of the emulsion as the light for exposing the emulsion layer.

The emulsion is advantageously chemically sensitized with salts of noble metals such as ruthenium, rhodium, palladium, iridium, platinum, etc., as described in U.S. Pat. Nos. 2,448,060; 2,566,245; and 2,566,263. Also, as is described in U.S. Pat. No. 2,339,083, the emulsion can be chemically sensitized with a gold salt or, as is described in U.S. Pat. Nos. 2,597,856 and 2,597,915, it can be stabilized with a gold metal. Furthermore, a thiopolymer as described in U.S. Pat. No. 3,046,129 can advantageously be incorporated in the emulsion. In addition, the emulsion can be stabilized with mercury compounds as described in U.S. Pat. No. 3,046,129, column 20, line 51 to column 21, line 3, triazoles, azaindenes, disulfides, quaternary benzothiazolium compounds, zinc salts and cadmium salts.

The emulsion can contain light-absorbing dyes as described in U.S. Pat. Nos. 2,527,583; 2,611,696; 3,247,127; 3,260,601; etc.

The emulsion can be advantageously hardened with a suitable hardening agent for a hydrophilic colloid, such as formaldehyde or like hardener; N-methylol compounds as described in U.S. Pat. Nos. 2,732,316 and 2,586,168; carbodiimide compounds as described in U.S. Pat. No. 3,100,704; epoxy compounds as described in U.S. Pat. No. 3,091,537; halogen-substituted fatty acids (e.g., mucobromic acid, etc); compounds having many acid anhydride groups; methanesulfonic acid bisester; dialdehydes or sodium bisulfite adducts thereof such as β-methylglutaraldehyde bissodium bisulfite; bisaziridinecarboxamide (e.g., trimethylenebis(1-aziridinecarboxamide); triazine derivatives (e.g., 2-hydroxy-4,6-dichloro-s-triazine, etc.); and the like.

The silver halide emulsion is coated on a masking layer or after adding a coating aid as described in U.S. Pat. No. 3,046,129. The silver halide emulsion layer suitably has a thickness of about 0.3 μ or higher and preferably has a thickness of less than about 10 μ and can be coated at least on the masking layer and, if necessary, on both sides of the support.

If desired, a backing layer, an antihalation layer, an interlayer, an uppermost layer (e.g., a protective layer, etc.), and the like can be provided on the support, the masking layer or the emulsion layer.

Formation of a silver image in the silver halide emulsion layer can be effected using ordinary photographic processings, that is, by development-processing the exposed emulsion layer and, if necessary, fixing. Conventional photographic processings including exposure, development, fixing, etc., which can be used are described in detail in *Kodak Data Book* P-52, "Techniques of Microphotography"(1970), Rochester, N.Y.

Suitable developing agents which can be used in the method of the present invention for forming silver images are those well known in the art, such as the dihydroxybenzenes (e.g., hydroquinone, chlorohydroquinone, bromohydroquinone, isopropylhydroquinone, toluhydroquinone, methylhydroquinone, 2,3-dichlorohydroquinone, 2,5-dimethylhydroquinone, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, N-methyl-o-aminophenol, N-methyl-p-aminophenol, 2,4-diaminophenol, etc.), pyrogallol, ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), and mixtures thereof. The developer generally possesses a pH of not less than about 8, preferably about 8.5 to 12.5.

The developer can contain, if desired, a preservative (e.g., a sulfite, a bisulfite, etc.), a buffer (e.g., a carbonate, boric acid, a borate, an alkanolamine, etc.), a dissolving aid (e.g., a polyethylene glycol, etc.), a pH-adjusting agent (e.g., acetic acid or a like organic acid, etc.), a sensitizing agent (e.g., a quaternary ammonium salt, etc.), a development accelerator, a surface active agent, etc.

Suitable fixing agents for silver halide are the generally well known solvents for silver halide, such as a water-soluble thiosulfate (e.g., potassium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble, sulfur-containing organic dibasic acid (e.g., ethylenebisthioglycolic acid, etc.), a water-soluble salt thereof (e.g., sodium ethylenebisthioglycolate, potassium ethylenebisthioglycolate), and a mixture thereof.

The fixing agent-containing solution can contain, if desired, a preservative (e.g., a sulfite, a bisulfite, etc.), a pH buffer (e.g., boric acid, a borate, etc.), a pH-adjusting agent (e.g., acetic acid, etc.), a chelating agent, and the like.

Thus, a silver image is formed in the exposed areas. In the unexposed areas, silver halide still remains or is removed through fixation, while the binder of the silver halide emulsion layer remains intact. Where a silver halide emulsion is a reversal type emulsion or where reversal processing is conducted, the binder layer remains in the exposed areas, whereas a silver image is formed in the unexposed areas. The silver image formed at this stage is so poor in mechanical strength that it is difficult to use the silver image many times as a photomask.

Then, the silver image is removed through etch-bleaching. Etch-bleaching means the phenomenon that, when the silver image-containing layer is processed with an etch-bleaching solution, the silver image areas are removed from the layer together with the binder. The composition of the etch-bleaching solution can be appropriately selected from those solutions which have already been known. For example, suitable compositions are a composition comprising cupric chloride, citric acid and an aqueous solution of hydrogen peroxide; a composition comprising cupric nitrate, potassium bromide, lactic acid and an aqueous solution of hydrogen peroxide; a composition comprising ferric nitrate, potassium bromide, lactic acid and an aqueous solution of hydrogen peroxide; and the like. Suitable etching-bleaching solutions which can be used are described further in TAGA *Proceedings* pp 1–11, 1967 and *PSA Technical Quarterly*, Nov. 1955 pp 130–134. Since the completion of etch-bleaching processing is recognizable by the complete disappearance of the silver image, it is not necessary to designate a particular processing time. Generally, the processing time ranges from about 2 to 10 minutes at about 15° to 50°C, preferably 20° to 30°C. Since the silver image is removed with the etch-bleaching solution, the masking surface is uncovered thereunder. On the other hand, the binder layer of the unexposed areas not having been etch-bleached (in the case of reversal development, the binder layer of exposed areas) remain intact.

Then, the remaining binder layer is subjected to baking. In this case, baking is conducted so that the binder layer does not permit penetration of an etching solution or that it is not swollen or dissolved by an etching solution in the subsequent etching processing. Surprisingly enough, when baked, the binder layer does not permit an etching solution to penetrate, which may be attributed to the decomposition of the binder. On consideration of the fact that a non-baked binder layer cannot be a resist due to penetration of an etching solution emphasizes the importance of baking in the present invention. Baking conditions can be appropriately selected within the aforesaid range. However, in general, baking can be effected by heating at least the binder layer in a vacuum or in an atmosphere of, e.g., oxygen, nitrogen, argon, helium, air, etc., with air being preferred at temperatures not less than about 150°C, preferably 300° to 500°C to decompose the binder. If the baking temperature is too low, the baking time increases, while, if the temperature is too high, the support is deformed. A suitable baking time can range from about 15 seconds to 30 minutes at about 250° to 600°C, preferably 1 to 5 minutes at 350° to 500°C. At this stage, the masking layer does not undergo any chemical change.

Subsequent to baking, etching is conducted in order to remove the masking layer uncovered. Therefore, the kind of the etching solution and the processing condition employed can be those generally used in the art. For example, suitable etching solutions for chromium and chromium oxide ($Cr_2O_3$) include an aqueous solution of cerium ammonium nitrate (at a concentration of about 80 to 250 g/l) and 70% perchloric acid (at a concentration of about 20 to 80 ml/l) with an etching time of about 15 sec. to 10 min. at a temperature of about 15° to 40°C, an aqueous solution of cerium (IV) sulfate (at a concentration of about 40 to 200 g/l) and sulfuric acid (at a concentration of about 20 to 100 ml/l) with an etching time of about 20 sec. to 6 min. at a temperature of about 15°C to 40°C; for iron oxide include an aqueous solution of hydrochloric acid (at a concentration of about 1 to 12 N) with an etching time of about 10 sec. to 4 min. at a temperature of about 30° to 60°C; for silicon dioxide include hydrofluoric acid (at an aqueous solution concentration of about 6 to 48% by weight) with an etching time of about 10 sec. to 1 min. at about 15° to 40°C, a mixture of about 0.5 to 2 parts by volume of hydrofluoric acid (an aqueous solution of a concentration of about 48% by weight) and about 6 to 24 parts by volume of ammonium fluoride (an aqueous solution of a concentration of about 40% by weight) with an etching time of about 30 sec. to 5 min. at about 15° to 40°C; for nickel include an aqueous solution of ferric chloride (at a concentration of about 5 to 300 g/l) with an etching time of about 1 to 5 min. at about 15° to 40°C; and for titanium include an aqueous solution of hydrofluoric acid (at a concentration of about 5 to 40% by weight) with an etching time of about 20 sec. to 2 min. at about 20° to 40°C, etc.

The masking layer at the areas corresponding to the silver image is removed through etching processing to uncover the surface of the support. Since the masking layer and the baked binder layer remain on the non-silver image areas, the binder layer is then removed. The baked binder layer can be easily removed by dissolving or swelling the layer. Removal can be effected by using an alkali (e.g., using an aqueous solution of sodium hydroxide of a concentration of about 10 to 20% by weight at about 40 to 60°C for about 2 to 10 minutes, an aqueous solution of potassium hydroxide of a concentration of about 10 to 20% by weight for about 2 to 5 minutes, etc.), sodium hypochlorite (e.g., using concentration of about 10 to 20% by weight at about 30° to 60°C for about 1 to 5 minutes) or an acid (e.g., using 15% hydrochloric acid, using concentrated (98%) sulfuric acid at about 60° to 95°C for about 5 to 10 minutes, concentrated nitric acid (70%) at about 50° to 98°C for about 2 to 10 minutes, etc.). Thus, a photomask which transmits ultraviolet light only at the areas corresponding to silver image areas is obtained. That is, this photomask forms a mask image which is in a positive-positive relationship with the original. Of course, a mask image in a negative-positive relationship with an original can be obtained by using a reversal emulsion and/or conducting reversal processing as is described before.

The present invention will be described in greater detail by reference to the accompanying figures.

Figure 2:
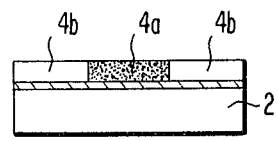
Figure 3:
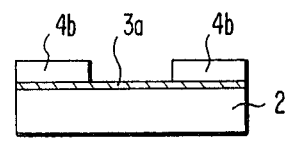
Figure 4:
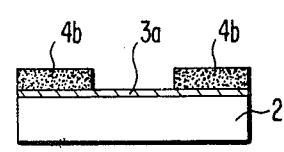
Figure 5:
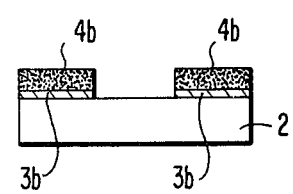
Figure 6:
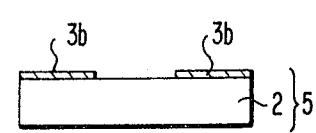

In FIG. 1, photographic light-sensitive material 1 comprises transparent support 2 having thereon masking layer 3 and silver halide emulsion layer 4. When photographic light-sensitive material 1 is exposed in the direction indicated by the arrows and then development-processed, silver image areas 4a and binder layer (non-silver image areas) 4b are formed as illustrated in FIG. 2. Upon immersing the composite in an etch-bleaching solution, silver image areas 4b are removed as illustrated in FIG. 3 to uncover masking layer 3a at the corresponding areas. Subsequently, binder layer 4b is baked (FIG. 4) and then subjected to etching. Thus, masking layer 3a is removed while baked binder layer 4b and underlying masking layer 3b remain as illustrated in FIG. 5. Finally, baked binder layer 4b is swollen or dissolved to leave only masking layer 3b. Thus, photomask 5 (FIG. 6) is obtained.

According to the method of the present invention, a photomask can be produced without using a photoresist method, and thus the steps are simplified.

In addition, the resulting photomask possesses high resolving power, high sensitivity and markedly improved durability.

In the present invention, the optical density of silver image need not necessarily be different from ordinary silver halide photography. The silver image functions only as a medium for converting an emulsion layer to a resist image corresponding to an original image. That is, in ordinary photography, the optical density of silver image is reduced, with a reduction in the thickness of the emulsion layer, to an extent that it cannot be practically used, while, in the present invention, the thickness of the emulsion layer is such that the emulsion layer is removed according to original image to form a resist image of the emulsion layer. Therefore, a film thickness as thin as about 1/15 that necessary for obtaining sufficient optical density using a conventional photographic emulsion is employable (provided that the proportion of silver in the emulsion is the same). The thinness of the emulsion layer provides the following advantages, and the resulting image is more excellent than that obtained by conventional photography. A first advantage is that the thinness serves to reduce the scattering of light by the silver halide grains in the emulsion layer, thus improving the resolving power. A second advantage is that the thinness ensures the ability to achieve good focus upon projecting an image on an emulsion layer through a lens. That is, an optical system to obtain a resolving power of 500 to 1000 lines/mm, the focal depth is around 5 $\mu$, and hence the thickness of the emulsion is desirably much less than this. However, a conventional silver halide photographic emulsion has a thickness of 5 $\mu$ or greater. A third advantage is that the thinness serves to reduce the reduction in resolving power due to halation. A fourth advantage is that, in the case of conducting etch-bleaching or a like chemical processing or baking, the thinness serves to improve the resolving power. A fifth merit is that less silver is used.

The following examples are given to illustrate the invention in greater detail. Unless otherwise indicated, all parts and percents are by weight.

EXAMPLE 1

1100 ml of a silver bromide emulsion (mean grain size of silver bromide: about 0.06 $\mu$) was prepared using 50 g of gelatin and 188 g of silver bromide. To this emulsion was added 0.25 g of 4-methyl-2,3-diethoxathiazolocarbocyanine iodide to optically sensitize the emulsion to light of a wavelength of 510 m$\mu$ ~ 530 m$\mu$. Then, the emulsion was coated in a thickness of about 2 μ on a chromium layer of a thickness of about 0.1 μ vacuum-deposited on a glass plate, and then dried to obtain a photographic light-sensitive material. This photographic light-sensitive material was imagewise exposed and development-processed in a developer having the following composition (24°C, 5 min), followed by fixing in a fixing solution (24°C, 1 min) to obtain a silver image.

| Developer | | |
|---|---|---|
| 1-Phenyl-3-pyrazolidone | 0.5 | g |
| Sodium Sulfite | 50 | g |
| Hydroquinone | 12 | g |
| Sodium Carbonate (monohydrate) | 60 | g |
| Potassium Bromide | 2 | g |
| Benzotriazole | 0.2 | g |
| 1-phenyl-5-mercaptotetrazole | 5 | mg |
| Phenazine-2-carboxylic Acid | 1 | g |
| Water to make | 1 | l |
| Fixing Solution | | |
| 70% Aqueous Solution of Ammonium Thiosulfate | 200 | cc |
| Sodium Sulfite | 15 | g |
| Boric Acid | 8 | g |
| Glacial Acetic Acid | 16 | cc |
| Aluminum Sulfate | 10 | g |
| Sulfuric Acid | 2 | cc |
| Water to make | 1 | l |

Then, the photographic material was immersed in an etch-bleaching solution having the following composition for 2 minutes at 20°C, then washed and dried.

| Etch-Bleaching Solution | | |
|---|---|---|
| Solution A: | Cupric Chloride | 10 g/l |
| | Citric Acid | 10 g/l |
| Solution B: | 3% Aqueous Solution of Hydrogen Peroxide | |

(Upon use, Solution A and Solution B were mixed with each other in a volume ratio of 1:1 to prepare an etch-bleaching solution.)

After being dried, the photographic material was heated for about 3 minutes in air at about 400°C to bake, and immersed for about 1 minute in an etching solution having the following composition. Thus, the chromium layer at the exposed areas was etched away.

| Etching Solution | | |
|---|---|---|
| Cerium Ammonium Nitrate | 164.5 | g |
| 70% Perchloric Acid | 43 | ml |
| Water to make | 1 | l |

Then, the photographic material was immersed for 3 minutes in a 20% aqueous solution of sodium hydroxide (40°C) to thereby remove the baked gelatin layer.

A photomask containing 4 μm lines with smooth edges and high contrast was obtained.

EXAMPLE 2

The same procedures as described in Example 1 were conducted except for replacing the chromium with chromium oxide (thickness: 0.22 μ). Substantially the same results as obtained in Example 1 were obtained.

EXAMPLE 3

Iron was vacuum-deposited in a thickness of about 0.22 μ on a glass and heated for 5 minutes at 450°C in the air to convert the iron to magnetic iron oxide. On this was coated the same silver halide emulsion as in Example 1. Subsequent procedures in Example 1 up to the etch-bleaching were conducted in a similar manner. After being dried, the material was heated for 2 minutes and 30 seconds at 500°C in air, and then immersed for about 1 minute in a bath prepared by diluting concentrated (35% by weight) hydrochloric acid 6 times with water and heated to 40°C to thereby etch the magnetic iron oxide layer. Substantially the same results as obtained in Example 1 were obtained.

EXAMPLE 4

The same procedures as described in Example 1 were conducted except for using the following procedure in place of fixing. That is, the material was washed with water, subsequent to development, for 10 minutes without fixing, followed by converting the silver image to silver halide with the following bleaching solution.

| Bleaching Solution | | |
|---|---|---|
| Potassium Dichromate | 5 | g |
| Concentrated Sulfuric Acid (98% by weight) | 10 | ml |
| Water to make | 1 | l |

Subsequently, the material was washed with water for 10 minutes and uniformly exposed for 2 minutes at a distance of 2 meters from a 100 W tungsten electric bulb. The exposure amount was about 8,000 lx.sec. Furthermore, the material was developed for 3 minutes at 20°C in the following developer, then washed with water.

| Developer | | |
|---|---|---|
| Monomethyl-p-aminophenol | 2 | g |
| Hydroquinone | 4 | g |
| Sodium Sulfite (anhydrous) | 25 | g |
| Sodium Carbonate (anhydrous) | 18.5 | g |
| Potassium Bromide | 2 | g |
| Water to make | 1 | l |

After being washed with water for 10 minutes, the material was etch-bleached in the same manner as in Example 1 to thereby remove the silver image areas. Subsequently, the material was washed, dried, and heated for 3 minutes at 400°C in air. Then etching of the masking layer and the subsequent processings were conducted in the same manner as in Example 1. Substantially the same results as obtained in Example 1 were obtained.

EXAMPLE 5

The same procedures as described in Example 1 were conducted except for using titanium in place of the chromium. The etching solution for titanium was a solution prepared by mixing 1 volume of 48% hydrofluoric acid and 9 volumes of water. The etching time was about 1 minute. Substantially the same results as obtained in Example 1 were obtained.

EXAMPLE 6

The same procedures as described in Example 1 were conducted except for using silicon dioxide and an impurity in place of chromium.

The silicon dioxide layer was provided in a thickness of about 0.3 μ on a glass plate by sputtering. Upon sputtering of the silicon dioxide, silver was simultaneously sputtered in order to incorporate silver as an impurity in the silicon dioxide. After this processing, the masking layer of silicon dioxide appeared transparent yellow. Etching of the masking layer was effected using the following etching solution.

| | |
|---|---|
| 48% Hydrofluoric Acid | 1 volume |
| 40% Ammonium Fluoride | 12 volumes |

The etching time was 30 seconds. Substantially the same results as obtained in Example 1 were obtained.

EXAMPLE 7

The same procedures as described in Example 1 were conducted except for effecting the etch-bleaching without fixing. The subsequent processings were the same as in Example 1. Substantially the same results as obtained in Example 1 were obtained.

EXAMPLE 8

The same procedures as described in Example 1 were conducted except for adjusting the thickness of the emulsion layer to 0.6 $\mu$. Almost no side-etching occurred upon etch-bleaching, and the resolving power was superior to that in Example 1. Substantially the same results as obtained in Example 1 were obtained.

While the invention has been described in detail and with reference to specific embodiments thereof, it will be apparent to one skilled in the art that various changes and modifications can be made therein without departing from the spirit and scope thereof.

What is claimed is:

1. A method for producing a photomask, which comprises exposing and development-processing a photographic material comprising a transparent support having thereon a masking layer and a silver halide emulsion layer to thereby form a silver image, etch-bleaching said silver halide emulsion layer to thereby remove the silver image areas, baking the remaining non-silver image areas to thereby decompose the binder contained therein, to prevent being swollen, dissolved or penetrated by an etching solution which would otherwise swell, dissolve or pentrate the unbaked binder, subjecting the support, masking layer and decomposed binder to said etching solution to thereby remove the masking layer located at the areas corresponding to the silver image, and removing the decomposed binder to thereby uncover the masking layer at the areas corresponding to the non-silver image areas.

2. The method of claim 1, wherein said support is a glass plate, quartz, sapphire, or a synthetic resin film.

3. The method of claim 1, wherein said masking layer is a layer of a material which transmits visible light and absorbs ultraviolet light.

4. The method of claim 1, wherein said masking layer is a layer of a metal, a metal oxide, a semi-metal, or a chalcogen glass.

5. The method of claim 4, wherein said metal oxide is silicon dioxide, chromium oxide, ferric oxide, magnetic iron oxide, iron (II)-iron (III) oxide, cuprous oxide, cupric oxide, nickel oxide, cobalt oxide, germanium oxide, cadmium oxide, titanium oxide, or tantalum oxide, said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy or a nickel-chromium alloy, said semi-metal is silicon or germanium and said chalcogen glass is As-S-Ge, As-Se-Ge, or Ge-S.

6. The method of claim 3, wherein said masking layer transmits well light of a wavelength not less than about 450 nm and well absorbs light having a wavelength shorter than 450 nm.

7. The method of claim 1, wherein said masking layer has a thickness ranging from about 0.07 micron to 1.5 microns.

8. The method of claim 1, wherein said silver halide emulsion layer is an emulsion layer of silver chloride, silver bromide, silver iodide, silver chlorobromide, silver bromoiodide, or silver chlorobromoiodide.

9. The method of claim 8, wherein said silver halide emulsion is an emulsion containing about 90 mole % or higher silver bromide and not more than about 5 mole % silver iodide and the mean grain size of the silver halide grains is not more than about 0.1 micron and wherein the weight ratio of the silver halide to the water-soluble binder of the emulsion is about 1:4 to about 6:1.

10. The method of claim 8, wherein said silver halide emulsion is an emulsion which contains about 50 mole % or higher silver chloride and contains silver halide grains having a mean grain size of not more than about 1 micron.

11. The method of claim 1, wherein said silver halide emulsion layer has the thickness of less than about 10 microns.

12. The method of claim 1, wherein said etch-bleaching is with a composition containing cupric chloride, citric acid and hydrogen peroxide; a composition containing cupric nitrate, potassium bromide, lactic acid and hydrogen peroxide; or a composition containing ferric nitrate, potassium bromide, lactic acid and hydrogen peroxide.

13. The method of claim 1, wherein the baking is at a temperature of at least about 150°C.

14. The method of claim 1, wherein the removing of the non-silver image areas is by swelling or dissolving the binder layer remaining using an alkali solution, a hypochlorite solution, or an acid solution.

15. The method of claim 1, wherein said etch-bleaching of said silver halide emulsion layer is at a temperature of about 15°C to 50°C.

* * * * *